United States Patent
Strenglein

[11] 4,300,092
[45] Nov. 10, 1981

[54] PHASE MATCH MEASURING SYSTEM

[75] Inventor: Harry F. Strenglein, Clearwater, Fla.

[73] Assignee: Sperry Corporation, New York, N.Y.

[21] Appl. No.: 132,741

[22] Filed: Mar. 24, 1980

[51] Int. Cl.³ .............................................. G01R 27/00
[52] U.S. Cl. .................. 324/57 R; 324/58 B; 324/84
[58] Field of Search ............ 324/57 SS, 57 PS, 57 H, 324/58 B, 58.5 B, 84, 57 R

[56] References Cited

U.S. PATENT DOCUMENTS

| | | | |
|---|---|---|---|
| 2,630,474 | 3/1953 | Brown | 324/58 B |
| 2,861,177 | 11/1958 | Dishal et al. | 324/57 H |
| 2,887,652 | 5/1959 | Bendayan et al. | 324/57 H |
| 2,954,524 | 9/1960 | Nelson | 324/57 SS X |
| 2,986,696 | 5/1961 | Seay | 324/57 SS X |
| 3,179,881 | 4/1965 | Ichijo | 324/84 X |
| 3,395,346 | 7/1968 | Kincheloe et al. | 324/84 X |
| 3,400,329 | 9/1968 | Cannon | 324/57 SS |

*Primary Examiner*—Stanley T. Krawczewicz
*Attorney, Agent, or Firm*—Howard P. Terry; Terry J. Ilardi

[57] ABSTRACT

An apparatus for phase matching transmission lines which generates signals with frequencies and phase characteristics that are representative of the length of the transmission line under test and alternately samples and compares these signals to minimize signal source instabilities.

9 Claims, 9 Drawing Figures

PHASE MATCH MEASURING SYSTEM

BACKGROUND OF THE INVENTION

1. Field of the Invention

This invention pertains to the measurement of cable characteristics and more particularly relates to an apparatus for determining the relative phase shift between transmission lines and for achieving a phase match therebetween.

2. Description of the Prior Art

In the prior art, phase measuring methods were essentially laboratory techniques which yielded good results for transmission lines that were physically or electrically short. In recent years, however, the need to assure the phase match of long cables installed in aircraft has arisen, creating new problems. The great length of such cables has required that the physical separation of the cables' ends be large, often necessitating either remote responding instrumentation, or technicians located at each end of the transmission lines in communication with each other. Often one end of a cable is inaccessible, rendering location of a technician at that end inconvenient. Additionally, the cramped quarters of an aircraft's interior requires that, regardless of the solution adopted, the physical size and number of the instruments used should be minimized. One method used in the prior art, is an adaptation of a laboratory phase bridge. In this method, power from a signal generator is divided in a power divider and fed to each transmission line under test, the free end of each transmission line being connected to a conventional phase bridge. The operator can then adjust phase shifters and attenuators within the phase bridge to achieve a null condition. Phase match is indicated by noting the adjustments needed to achieve this condition.

In addition to the previously mentioned problems, the phase bridge technique suffers from several other drawbacks. Automatic operation is difficult to provide over reasonably broad frequency ranges and the process is difficult and tedious if the nulling operation is performed manually. Furthermore, the electrical instability of long cables and connectors in the system can be a major problem because it is difficult to insure that all connections are tight and stable in a method as slow as the phase bridge technique.

A better solution previously in use utilizes a superheterodyne receiver technique. In this method, a signal is applied to one end of the cables under test while the other ends are connected to the input terminal of a dual receiver, wherein the signals are mixed with a local oscillator thereby producing IF signals for each input. Since a common local oscillator is employed for producing the IF signals, the relative phase between the cables is maintained at the IF frequency and can be readily detected. This technique, while adaptable to automation and remote operation, retains the problems of physical bulk resulting from the method's complexity, and cable instability. Additionally, if operation over a broad range of frequencies is required, the necessity for good phase symmetry in the power divider and receiver can be cost prohibitive.

The present invention provides a simple method for obtaining the desired phase match information without the requirement for instrumentation at both ends of the cable.

SUMMARY OF THE INVENTION

According to the principles of the present invention, the phase match of a plurality of transmission lines is determined by coupling an incident linear FM ramp signal to the transmission lines to be matched. These transmission lines are terminated in such a manner as to provide a reflection of the incident linear FM ramp signal. The incident and reflected linear FM ramp signals are then applied to a mixer which heterodynes the incident and reflected signals. The resulting difference signal of the mixer output is representative of the length of the transmission line to which the incident signal has been applied. By alternately applying the incident linear FM ramp to each transmission line under test, and sampling and comparing the resulting mixer output signal corresponding to each transmission line on an oscilloscope or other display device, the phase match variation of the transmission lines is determined.

DESCRIPTION OF THE PREFERRED EMBODIMENTS

Figure 1:
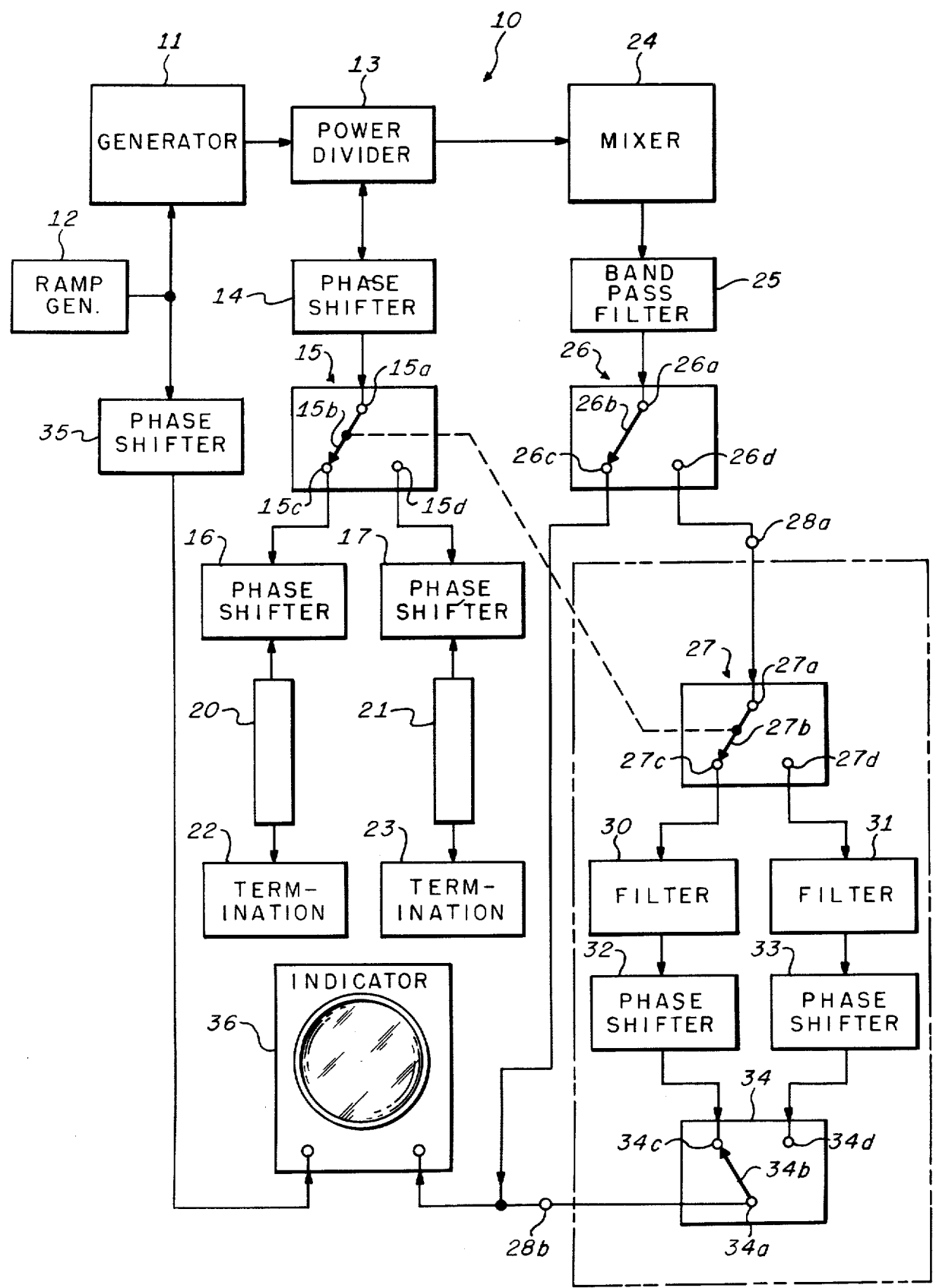
FIG. 1 is a schematic representation of the preferred embodiment of the invention.

Referring to FIG. 1, a phase match measuring apparatus 10 may include a generator 11 coupled to ramp generator 12 to produce a linear FM signal. This incident linear FM signal is coupled via power divider 13 to mixer 24 and phase shifter 14. Phase shifter 14 is further coupled to common terminal 15a of switch 15. Terminals 15c and 15d of switch 15 are coupled to phase shifters 16 and 17, respectively, which are in turn coupled to the transmission lines under test 20 and 21. The transmission lines 20 and 21 are further coupled to terminations 22 and 23 which can take the form of a short circuit, open circuit, or other transmission line impedance mismatch. Mixer 24 is further coupled to bandpass filter 25, which is in turn coupled to the common terminal 26a of switch 26. A signal correction circuit 28, which includes switch 27, filters 30 and 31, phase shifters 32 and 33, and switch 34 is coupled at input terminal 28a to terminal 26d of switch 26, and further coupled at output terminal 28b to the indicator means 36. The common terminal 27a of switch 27 is coupled to terminal 26d of switch 26. Terminal 27c of switch 27 is coupled to bandpass filter 30 which is in turn coupled to phase shifter 32. Phase shifter 32 is further coupled to terminal 34c of switch 34. Similarly, the remaining terminal 27d of switch 27 is coupled to filter 31 which is in turn coupled to phase shifter 33 which is further coupled to terminal 34d of switch 34. The common terminal 34a of switch 34 is coupled to indicator means 36. Phase shifter 35 is coupled to ramp generator 12 and indicator means 36.

Ramp generator 12 applies a ramp signal to frequency modulated signal generator 11 which in turn generates a linear FM signal with a time duration that exceeds the signal round trip time delay between the input and output terminals of the transmission lines 20 and 21. The ramp generated by ramp generator 12 is also utilized elsewhere as will be further discussed below. Assuming, for the purposes of the present explanation, that movable arm 15b of switch 15 is in contact with terminal 15c, then the incident linear FM signal will be applied to the transmission line 20 via power divider 13, phase shifter 14, switch 15 as described, and phase shifter 16. The linear FM signal then travels along transmission line 20 until it reaches termination 22. It is well known in the prior art that when the transmission line is terminated in an impedance whose value is not identical to the characteristic impedance of transmission line, the signal applied, or a portion thereof, will be reflected. In the preferred embodiment, the termination consists of a short circuit, although an open circuit or other impedance mismatch could be used as well. The signal incident to the termination 22 is reflected therefrom in accordance with the reflection coefficient of the termination to propagate back along the transmission line 20, and through phase shifter 16, switch 15, phase shifter 14, power divider 13 and coupled to mixer 24 wherein the linear FM signal incident to the transmission line 20 and the linear FM signal reflected from termination 22 are heterodyned.

Figure 2:
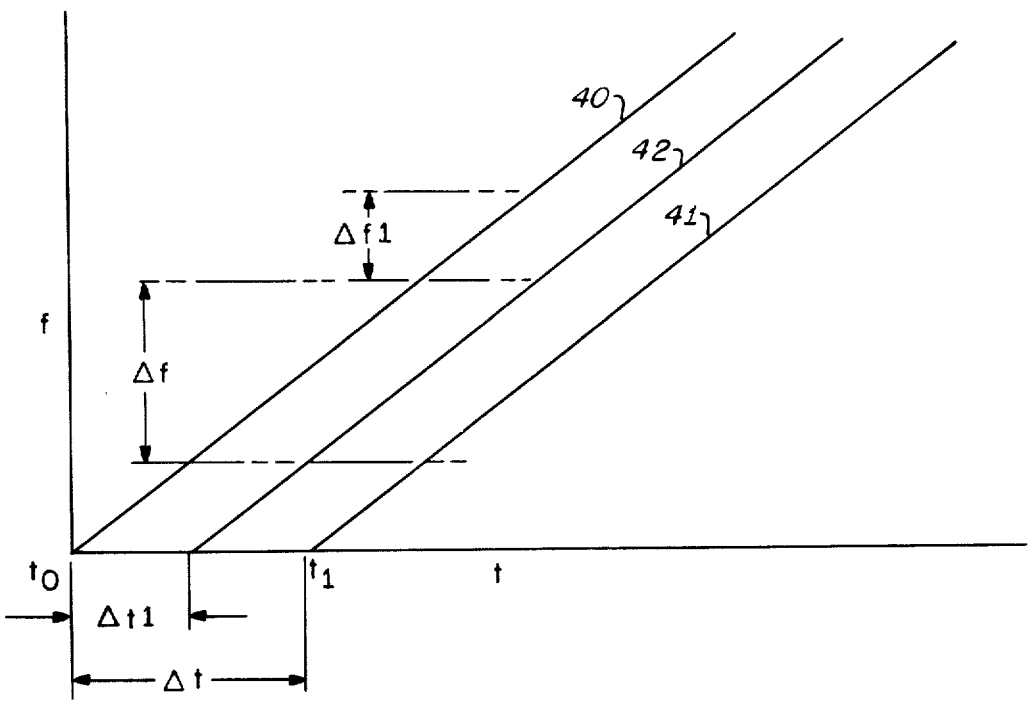
FIGS. 2 through 6c are graphs of waveforms useful in explaining the operation of the invention.

Referring now to FIG. 2, the frequency versus time characteristic of the incident signal 40 and reflected signal 41 as they appear at the input of mixer 24, is shown. The time denoted $\Delta t$, required for the incident signal to travel along the transmission line and reflect back, is directly proportional to the length of the transmission line being tested. Thus, if the incident signal 40 begins at time $t_o$, the reflected signal will not appear at the input to mixer 24 until time $t_1$, where $t_1-t_o=\Delta t$. Since the signals have a linear frequency versus time characteristic, there will be a constant frequency difference, denoted $\Delta f$, between incident signal 40 and 41. The mixer 24, will produce both sum and difference frequencies of which the lower frequency is selected by bandpass filter 25. Multiple reflections will ordinarily occur in the apparatus from sources other than the termination, such as the switches, near end connections, etc. These reflections will also mix with the incident signal in the mixer and generate sum and difference frequencies of their own. It is clear that such unwanted reflections will occur before the reflection due to the termination, because they are located physically and electrically closer to the mixer 24 input. Referring again to FIG. 2, it can be seen that signal 42, which represents one of the unwanted or near end reflections, arrives at the input terminal of the transmission line 22 after reflection at a time $\Delta t_1$, that is shorter than $\Delta t$. Consequently, $\Delta f_1$ as shown in the figure is lower in frequency than $\Delta f$.

The lower cut-off frequency of the bandpass filter 25 can be set just below the frequency difference $\Delta f$. In practice, however, it would be easier to use a fixed lower cut-off in the bandpass filter, and adjust the linear FM signal so that $\Delta f$ is greater than the lower cut-off frequency of bandpass filter 25. For convenience of operation, bandpass filter 25 may be designed to be centered at $\Delta f$.

When movable arm 26b of switch 26 is in contact with terminal 26c, the output of the bandpass filter 25 is coupled to the indicator means 36. The indicator may be an oscilloscope, in which case the signal would be coupled to the vertical input. The horizontal input of the oscilloscope is coupled to the output of the ramp generator 12. When the movable arm 15b of switch 15 is positioned in contact with terminal 15c, transmission line 20 will be under test and the output of bandpass filter 25 will consist of a sine wave of frequency $\Delta f$ corresponding to the length of the transmission line 20. When movable arm 15b of switch 15 is in contact with terminal 15d, transmission line 21 will now be under test and the output of bandpass filter 25 will also be a simple sinusoid, but of frequency $\Delta f'$, corresponding to the length of transmission line 21. Unless transmission lines 20 and 21 have identical lengths, $\Delta f$ and $\Delta f'$ will not be equal, and the difference between $\Delta f$ and $\Delta f'$ will be representative of the phase match variation between transmission lines 20 and 21.

Figure 3:
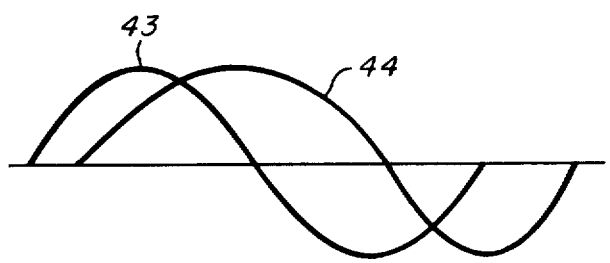

If switch 15 were switched so that a complete linear FM signal was alternately applied to each transmission line, waveforms as shown in FIG. 3 would result, where waveform 43 corresponds to the signal due to the length of transmission line 20 and waveform 44 corresponds to the length of transmission line 21. The horizontal displacement of the signals along the axis and difference in frequency of the waveforms is representative of the difference in length of the transmission lines 20 and 21. Such a waveform would also appear as a display on the oscilloscope 36 and the phase difference could be calculated therefrom. An easier method would be to adjust phase shifter 17 until the two signals are coincident and a single sinusoid is traced, at which time, the setting of phase shifter 17 can be noted. Phase shifter 16 is necessary to null out differences in the length of the circuitry from sources other than the differences in the transmission lines 15, and for those situations where the differences between the transmission lines is so great as to be out of the range of phase shifter 17. Since the reflected signal must travel the length of the transmission line twice, when phase shifter 17 is out of the circuit, or at the 0° phase shift adjustment, waveforms 43 and 44 will be separated in the oscilloscope display by a distance representative of twice the difference in length of the transmission lines under test.

Figure 4:
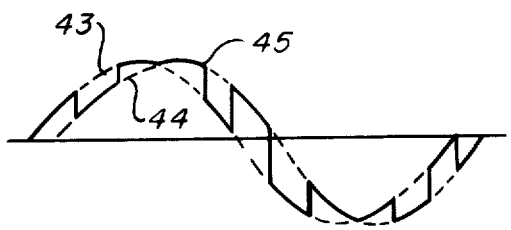

Neither signal generator 11 or ramp generator 12 are completely stable in practice and may thus cause the waveform corresponding to each transmission line to shift relative to each other with each ramp. This problem can be avoided by operating switch 15 at a frequency several times higher than $\Delta f$ and $\Delta f'$. The signal from each transmission line is thus sampled several times during each ramp and the oscillator instabilities therefore become far less significant. In FIG. 4, we see the previously examined waveforms 43 and 44 shown as dashed lines. An actual oscilloscope display would, however, show only the waveform 45 in solid line which results from switch 15 switching between each transmission line 20 and 21. As previously described, when phase shifter 17 has been adjusted to achieve coincidence of waveforms 43 and 44, a single sinusoid appears, and the vertical chopping marks would therefore disappear.

Figure 5A:
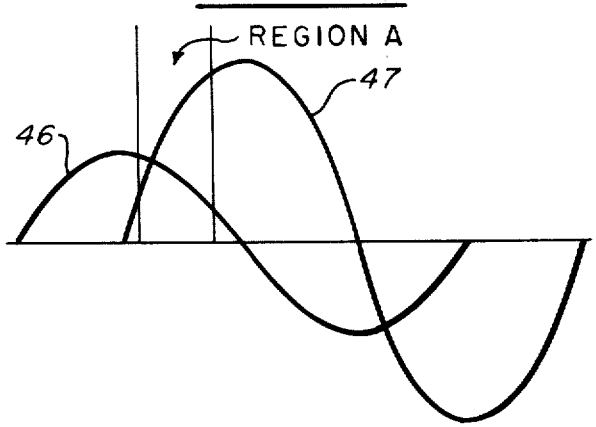
Figure 5B:
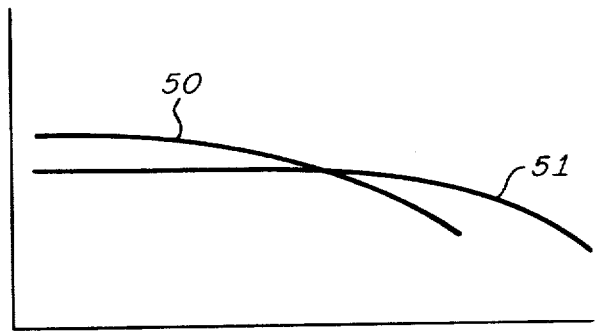

The invention described thus far has its greatest accuracy near the horizontal axis, where it is most sensitive to phase differences and least sensitive to amplitude differences. This characteristic can be more readily understood by reference to FIG. 5a. If one were to examine only region A of FIG. 5a, the waveforms 46 and 47, while containing the information we need, cannot be conveniently understood because less than a half cycle of waveforms 46 and 47, is displayed. The amplitude differential tends to skew the display, and without a zero crossing point with which to reference the waveforms, the phase differences become obscured. In those situations where very short cables are being tested, it may be difficult to produce a display near the horizontal axis, as shown by waveforms 50 and 51 in FIG. 5b. In this case, the reflection of the incident linear FM signal has occurred so quickly that there is insufficient time to complete a half cycle on the display. Phase shifter 14 or phase shifter 35 may be utilized to solve this problem. Either phase shifter can be adjusted to shift the signal to a portion of the waveform where there is a horizontal axis crossing displayed. If operation with only relatively long cables is anticipated, these phase shifters may be eliminated or bypassed.

In situations where the near end reflections for the transmission lines 20 and 21 differ substantially from one another in either amplitude, distance from the power divider, or both of these characteristics, a vertical displacement of one waveform with respect to the other may occur.

Figure 6A:
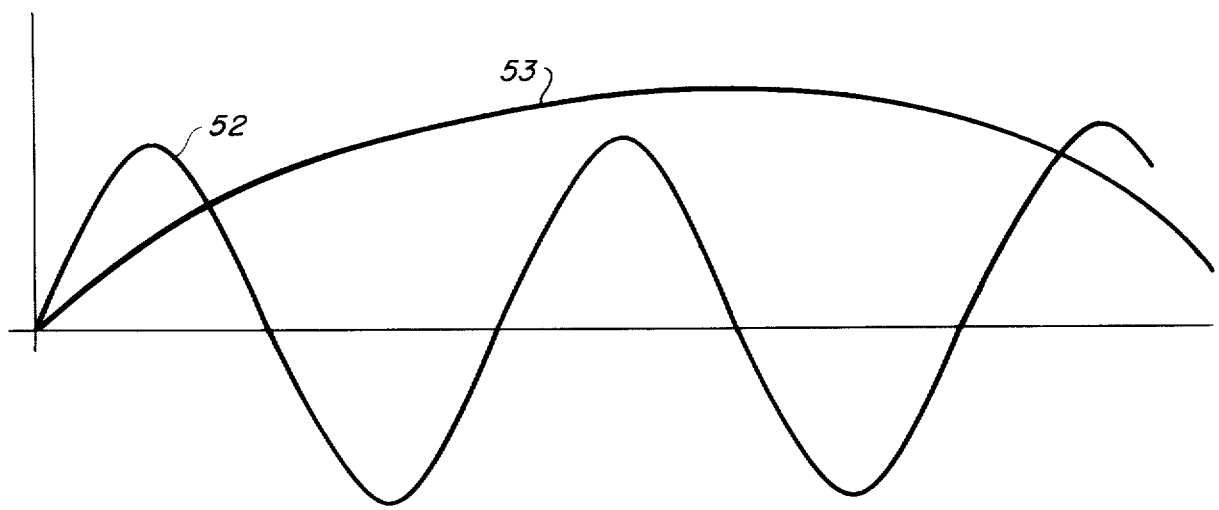
Figure 6B:
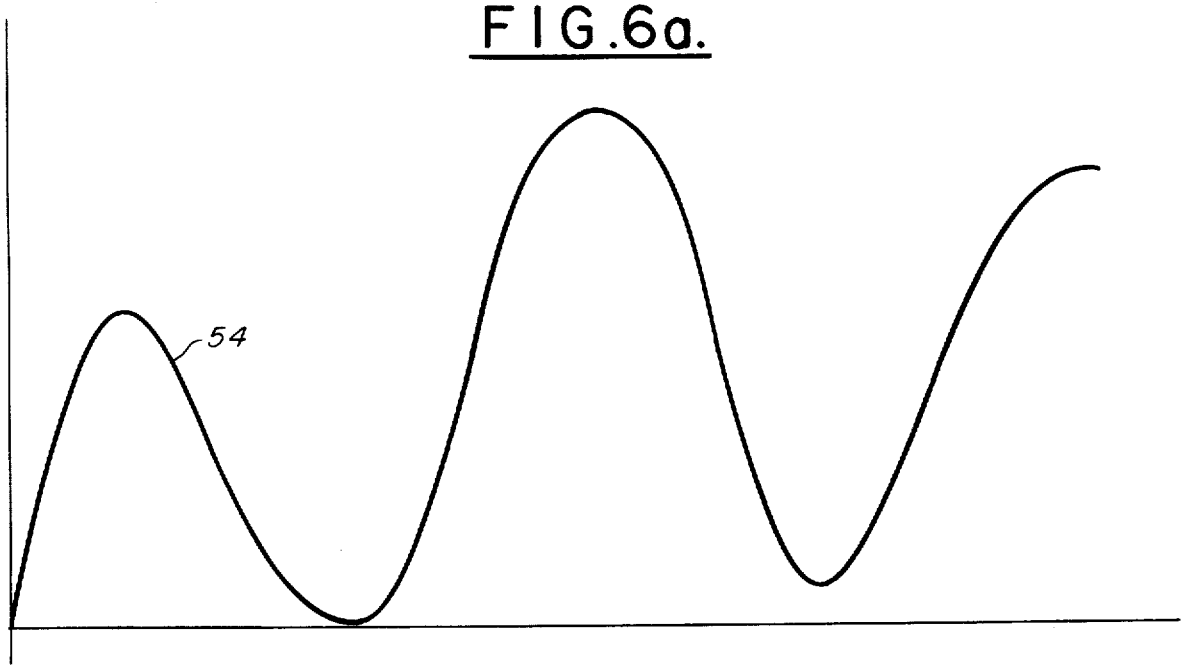
Figure 6C:
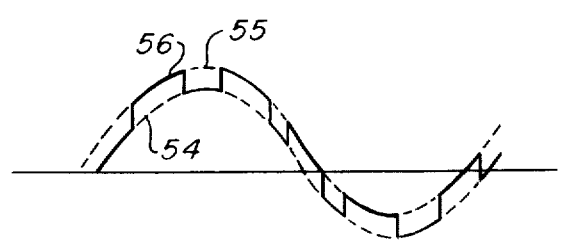

FIG. 6a shows that the near end reflection, which is much closer to the mixer input than the transmission line terminations 22 or 23 generates a signal 53 much lower in frequency than the signal 52 due to the reflection from the termination 46. If these signals 52 and 53 were displayed on oscilloscope 36, the vector sum of the signals would be traced, resulting in the waveform 54 shown in FIG. 6b. As described above, switch 15 samples the output from each transmission line at a rate considerably higher than $\Delta f$. The effect of this chopping, however, is to shift the spectral components of the near end reflection and the reflection due to the termination to a region centered around the higher chopping frequency. Since this region now carries the information we are interested in, it is necessary for it to fall within the passband of the bandpass filter 25, and not be removed from its output. The results, for the case where there is no phase difference between the transmission lines 20 and 21 is shown in FIG. 6c wherein waveform 54 is vertically displaced, while waveform 55 is not so displaced. After chopping, an oscilloscope trace would appear as shown by waveform 56. This situation will not occur when the circuitry between the power divider and the near end of the transmission lines being tested is symmetrical, because in such a case, the waveforms for both transmission lines are displaced equally and not relative to one another.

The difficulties caused by the unequal near end reflections are overcome by signal correction circuit 28 which is utilized when switch 26 is positioned so that movable arm 26b is in contact with terminal 26d. The signal from the output of the bandpass filter 25 is then routed to switch 27 which is switched in synchronism with switch 15 and thus reconstructs the signal corresponding to each transmission line at its terminals 27c and 27d. The unwanted low frequency content, corresponding to the near end reflection, can now be removed by filters 30 and 31. These filters have essentially the same low frequency characteristic as bandpass filter 25 and must also have good phase match. The outputs of filters 30 and 31 can then be coupled to phase shifters 32 and 33, respectively. These phase shifters perform the same function as phase shifters 16 and 17 and may be used in lieu of them. The reconstructed waveforms are then sampled by the action of switch 40, which, while operating at a frequency higher than $\Delta f$, need not be in synchronism with switch 15. The display that results will be as shown previously in FIG. 4, without any distortion due to a vertical displacement of the waveforms with respect to one another.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. An apparatus for phase matching a plurality of transmission lines comprising:
   means for coupling incident linear FM signals to said plurality of transmission lines;
   means for terminating each of said plurality of transmission lines for reflecting said linear FM signals; and
   means adapted to receive said incident linear FM signals and said reflected linear FM signals for mixing said incident and reflected linear FM signals to provide signals representative of the phase variations between said plurality of transmission lines.

2. An apparatus as recited in claim 1 wherein said coupling means includes means adapted to receive said linear FM signal for dividing said received FM signal between output means thereof and said mixing means; and
   first switch means coupled between said output means of said dividing means and said plurality of transmission lines for switchably coupling said output means of said dividing means to said plurality of transmission lines.

3. An apparatus as recited in claim 2 further comprising first phase shift means coupled between said transmission lines and said first switch means for phase shifting signals coupled to said transmission lines.

4. An apparatus as recited in claim 3 further comprising second phase shift means coupled between said output means of said dividing means and said first switching means for phase shifting signals received by said first switch means from said dividing means.

5. An apparatus as recited in claim 1 further comprising first frequency selection means coupled to receive signals from said mixing means for selecting frequencies within a predetermined band.

6. An apparatus as recited in claim 5 further comprising:
   second switch means having first and second output means and input means coupled to said first frequency selection means for switchably coupling said first frequency selection means to said first and second output means; and
   means having output means and input means coupled to said second output means of said second switch means for correcting said frequency selected signals from said first frequency selection means providing corrected signals at said output means of said signal correction means, whereby, with said second switch means positioned to couple said input means thereof to said second input means thereof, said frequency selected signal is coupled to said correction means and corrected therein.

7. An apparatus as recited in claim 6 wherein said signal correction means comprises:
   third switch means having output means and input means coupled to said output means of said second switch means for switchably coupling said input means of said third switch means to said output means of said third switch means;
   second frequency selection means coupled to said output means of said third switch means for selecting signals at frequencies within a predetermined frequency band and for providing such selected signals at output means thereof; and fourth switch means having output means and input means coupled to said output means of said second frequency selection means for switchably coupling said output means of said fourth switch means to said input means of said fourth switch means; whereby with said second switch means positioned to couple said input means thereof to said second output means thereof, said first switch means positioned to couple a preselected one of said plurality of transmission lines to said output means of said dividing means and said third and fourth switch means correspondingly positioned, a corrected signal representative of said signal reflected from said termination on said preselected transmission line is coupled to said output means of said fourth switch means.

8. An apparatus as recited in claim 7 wherein said signal correction means further comprises third phase shift means coupled between said second frequency selection means and said input means of said fourth switch means for phase shifting signals from said second frequency selection means.

9. An apparatus as recited in claims 5 or 6 further comprising means coupled to said first frequency selection means or signal correction means for indicating said signal representative of the phase match between said plurality of transmission lines, and further coupled to synchronize said representative signal with said incident linear FM signal.

* * * * *